US010311200B2

(12) United States Patent
Moroz et al.

(10) Patent No.: US 10,311,200 B2
(45) Date of Patent: Jun. 4, 2019

(54) PRE-SILICON DESIGN RULE EVALUATION

(71) Applicant: Synopsys, Inc., Mountain View, CA (US)

(72) Inventors: Victor Moroz, Saratoga, CA (US); Karim El Sayed, Santa Clara, CA (US); Terry Sylvan Kam-Chiu Ma, Danville, CA (US); Xi-Wei Lin, Fremont, CA (US); Qiang Lu, Foster City, CA (US)

(73) Assignee: Synopsys, Inc., Mountain View, CA (US)

( * ) Notice: Subject to any disclaimer, the term of this patent is extended or adjusted under 35 U.S.C. 154(b) by 61 days.

(21) Appl. No.: 15/227,863

(22) Filed: Aug. 3, 2016

(65) Prior Publication Data
US 2017/0039308 A1    Feb. 9, 2017

Related U.S. Application Data

(60) Provisional application No. 62/200,586, filed on Aug. 3, 2015.

(51) Int. Cl.
*G06F 17/50* (2006.01)
(52) U.S. Cl.
CPC ...... *G06F 17/5081* (2013.01); *G06F 17/5036* (2013.01)
(58) Field of Classification Search
USPC ........................................................ 716/107
See application file for complete search history.

(56) References Cited

U.S. PATENT DOCUMENTS

| 7,194,725 | B1 | 3/2007 | Lukanc et al. |
| 7,302,375 | B2 | 11/2007 | Kucherov et al. |
| 8,539,408 | B1* | 9/2013 | Cheng ................. G06F 17/5036 716/110 |
| 2003/0220770 | A1 | 11/2003 | Eikyu |
| 2005/0114808 | A1 | 5/2005 | McBride |
| 2008/0048790 | A1 | 2/2008 | Bang et al. |
| 2009/0249263 | A1 | 10/2009 | Arimoto |

(Continued)

OTHER PUBLICATIONS

PCT/US2016/045425—International Search Report dated Nov. 11, 2016, 11 pages.

(Continued)

*Primary Examiner* — Bryce M Aisaka
(74) *Attorney, Agent, or Firm* — Haynes Beffel & Wolfeld LLP

(57) ABSTRACT

Roughly described, a method for developing a set of design rules for a fabrication process in development includes, for each of several candidate DRUTs for the fabrication process, laying our a logic cell based on the DRUT, the logic cell having at least one transistor and at least one interconnect, simulating fabrication of the logic cell according to the fabrication process and the layout, simulating behavior of the logic cell structure, including characterizing the combined behavior of both the first transistor and the first interconnect, evaluating performance of the logic cell structure in dependence upon the behavior as characterized, and recording in a database, in association with an indication of the DRUT, values indicating performance of the logic cell. The database can be used to select the best DRUT for the fabrication process.

36 Claims, 10 Drawing Sheets

(56) References Cited

U.S. PATENT DOCUMENTS

2015/0112646 A1* 4/2015 Kamal ............... G06F 17/5068
                                                                                         703/1
2016/0070830 A1 3/2016 Moroz et al.

OTHER PUBLICATIONS

Luisier et al., "Quantum Transport Beyond the Effective Mass Approximation", dissertation, 2007, Zurich, Switzerland, 150 pages.
Arovas, Daniel, "Boltzmann Transport", UCSD, Chapter 1 of Physics 211B Lectures & Reading, http://physics.ucsd.edu/students/courses/winter2010/physics211b/LECTURES/CH01.pdf, visited Jul. 30, 2016.
Synopsys, Data Sheet, Sentaurus Workbench Comprehensive Framework Environment, 2005, 5 pages.
Mantooth and Vlach. "Beyond SPICE with Saber and MAST." In Circuits and Systems, 1992. ISCAS'92. Proceedings., 1992 IEEE International Symposium on, vol. 1, pp. 77-80. IEEE, 1992.
Grasser et al. "Advanced transport models for sub-micrometer devices." Simulation of Semiconductor Processes and Devices 2004. Springer Vienna, 2004. 1-8.
Palestri et al., "Comparison of Advanced Transport Models of Nanoscale nMOSFETs.", Conference Paper, Apr. 2009, 5 pages.
U.S. Appl. No. 13/507,310—U.S. Patent Application filed Jun. 20, 2012, 43 pages.

* cited by examiner

PRE-SILICON DESIGN RULE EVALUATION

CROSS REFERENCE TO RELATED APPLICATION

This application claims priority under 35 U.S.C. § 119(e) to U.S. Provisional Application No. 62/200,586, entitled "PRE-SILICON DESIGN RULE EVALUATION", filed on Aug. 3, 2015, by Victor Moroz, Karim El Sayed, Terry Sylvan Kam-Chiu Ma, Xi-Wei Lin, and Qiang Lu, the entire contents of which are hereby incorporated by reference herein.

BACKGROUND

This invention relates to a system and methods for developing design rule sets for integrated circuit fabrication processes, even before the fabrication process has been developed sufficiently to actually fabricate an integrated circuit device.

DESCRIPTION OF RELATED ART

When a new semiconductor fabrication technology is being created, a key part of the process development kit is a set of design rules. Design rules are a set of rules that are provided by a semiconductor manufacturer, which specify minimum or maximum geometric relationships among the features of a layout. A semiconductor manufacturing process always has some variability, and the purpose of design rules is to ensure that sufficient margin is included in the layout geometries to minimize the likelihood that the variability will result in loss of yield. A set of design rules is specific to a particular semiconductor manufacturing process, so new rules are provided to designers for each new process or significant process change.

Design rules range from very simple to very complex. For example, a simple design rule is minimum edge-to-edge spacing. This is the minimum spacing between two features in a single layer; a layout that places the edges of two features nearer to each other than the specified minimum spacing risks that the two features will touch each other on some or all of the devices actually fabricated using that layout. Many design rules specify more than one value for a particular parameter, such as an "absolute minimum" spacing, and a "preferred minimum" spacing. More complex rules include an End-of-line spacing rule, for example, which specifies the minimum spacing between the end of a line and its neighboring geometry, and can depend on many factors such as the width of the line, whether another parallel line is nearby, etc. Design rules can also specify constraints on edges in different layers. One rule, for example, specifies the minimum distance a shape on one layer must extend past a shape on a second layer. Design rule sets also often include area rules, such as the minimum area of an island or a hole in a layer. They can also include via rules, which specify constraints on geometric dimensions in the via layer, the island in the "cover" layer above the via, and the island in the "cover" layer below the via.

Integrated circuit layout engines typically attempt to optimize the layout of circuit designs. They are restricted however by the design rules provided by the fabrication vendor. It can be seen, therefore, that if fabrication vendors can optimize their design rules, then designers will be able to squeeze more performance and/or lower power or area out of their integrated circuit devices. Manufacturers therefore work hard to develop an optimal set of design rules for their fabrication processes.

Because it can be difficult to predict the impact of changing different design rules on circuit performance, the development of design rules usually involves trial and error. Multiple test structures are manufactured and evaluated, and adjustments are made to vary the structures for the next iteration. For a process being newly developed, however, or significantly changed, reliable test structures cannot be fabricated in the early stages of technology development.

In practice, therefore, many design rule decisions for new or significantly changed processes are made by conservative extrapolation from prior processes, resulting in design rules that are unnecessarily strict, therefore leaving potential performance/area gains on the table.

SUMMARY

An opportunity arises to improve the development of design rules early in the development of new or significantly changed semiconductor fabrication processes.

Roughly described, a black-box behavioral model approach is used in combination with predictive 3D TCAD characterization of a library cell to go from a particular set of design rules to simulated performance of a ring oscillator.

In certain embodiments, a simulated ring oscillator is used as a vehicle for evaluating technology performance. Ring oscillators (ROs) are built on several representative simulated library cells, for example inverters. Initially, high precision structural models of N- and P-channel transistors are fabricated by simulation from the fabrication process under test. A high precision but compute- and knowledge-intensive method, such as NEGF or Subband Boltzmann, is used to develop a drift-diffusion (DD) model of such transistors. Then for each design rule set under test (DRUT), the structure and materials composition of an RO stage is determined by simulation using both the fabrication process under test and a design rule set under test. The stage, which may be conveniently managed by establishing it as a library cell, is characterized by simulation using the DD models of the transistors therein. The characterized RO stage is then used as a black box and connected by simulation to form a ring oscillator, and the overall RO is characterized by simulation. These latter steps for evaluating a sample DRUT are much quicker to complete than the initial setup, and moreover they can be scripted and parallelized such that hundreds of DRUTs can be evaluated simultaneously, all before silicon transistors or ROs have been fabricated physically.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Integrated Circuit Manufacturing Flow

Figure 1:
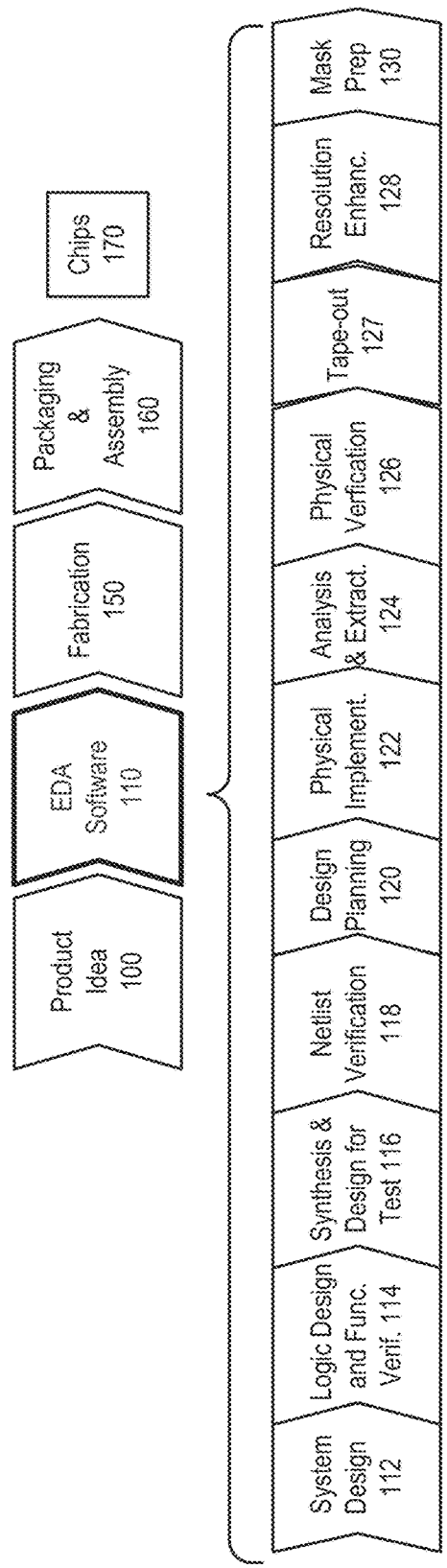
FIG. 1 shows a simplified representation of an illustrative integrated circuit design flow incorporating features of the technology.

FIG. 1 shows a simplified representation of an illustrative integrated circuit design flow incorporating features of the technology. At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products. This step is also sometimes referred to as 'layout', and this is where the constraints imposed by the design rules are felt most directly.

Analysis and extraction (step 124): At this step, the circuit function is verified at a transistor level, this in turn permits what-if refinement. Example EDA software products from Synopsys, Inc. that can be used at this step include Astro-Rail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape out" data for production of masks for lithographic use to produce finished chips. Example EDA software products from Synopsys, Inc. that can be used at this step include the CATS® family of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS® family of products.

A typical integrated circuit manufacturing flow also includes a related flow, as follows:

(1) Develop individual process steps for manufacturing the integrated circuit. This can be modeled with the Synopsys tools "Sentaurus Process", "Sentaurus Topography", and "Sentaurus Lithography". The input information here includes process conditions like temperature, reactor ambient, implant energy, etc. The output information is the changes in geometry or doping profiles or stress distribution. Aspects of the invention can be used in this step of the manufacturing flow.

(2) Integrate the individual process steps into the complete process flow. This can be modeled with the Synopsys tool "Sentaurus Process". The input information here includes the collection of the process steps in the appropriate sequence. The output includes the geometry, the doping profiles, and the stress distribution for the transistors and the space in between the transistors. Aspects of the invention can be used also in this step of the manufacturing flow.

(3) Analyze performance of the transistor manufactured with this process flow. This can be done with the Synopsys tool "Sentaurus Device". The input information here includes the output of step (2) and the biases applied to transistor terminals. The output information includes the currents and capacitances of the transistors for each bias combination. Aspects of the invention can be used also in this step of the manufacturing flow.

The output information developed in step (3) characterizes the transistors made using the process, and the characteristics, often in the form of Berkeley Short-Channel IGFET (BSIM) models, are then provided to circuit simulators such as HSPICE in order to permit a designer to analyze circuit designs at a transistor level. By analyzing the circuit at ta transistor level, the designer is able to develop better designs.

(4) If necessary, modify the process steps and the process flow to achieve the desired transistor performance. This can be done iteratively by using the Synopsys tools mentioned above.

Once the process flow is ready, it can be used for manufacturing multiple circuit designs coming from various designers in various companies. The EDA flow 112-130 will be used by such designers. The parallel flow described here can be used for example at a foundry to develop a process flow that can be used to manufacture designs coming from the designers. A combination of the process flow and the masks made from step 130 are used to manufacture any particular circuit. If the designers are at a different company, e.g. a fabless company, then usually it is the foundry that performs this parallel process flow whereas the process steps of FIG. 1 are performed typically by the fabless company. If the integrated circuit is manufactured at an IDM (integrated device manufacturer) company instead of the combination of a fabless company and a foundry, then both parallel flows described above are done at the same IDM company.

There is also a bridge between these tools and the 112-130 EDA tools. The bridge is a Synopsys tool "Seismos" that applies compact proximity models for particular circuit design and layout to obtain netlist with instance parameters for each individual transistor in the circuit as a function of its neighborhood and stress, including material conversion stress. This netlist is used in the analysis step 124.

Method for Developing a Design Rule Set

Figure 2:
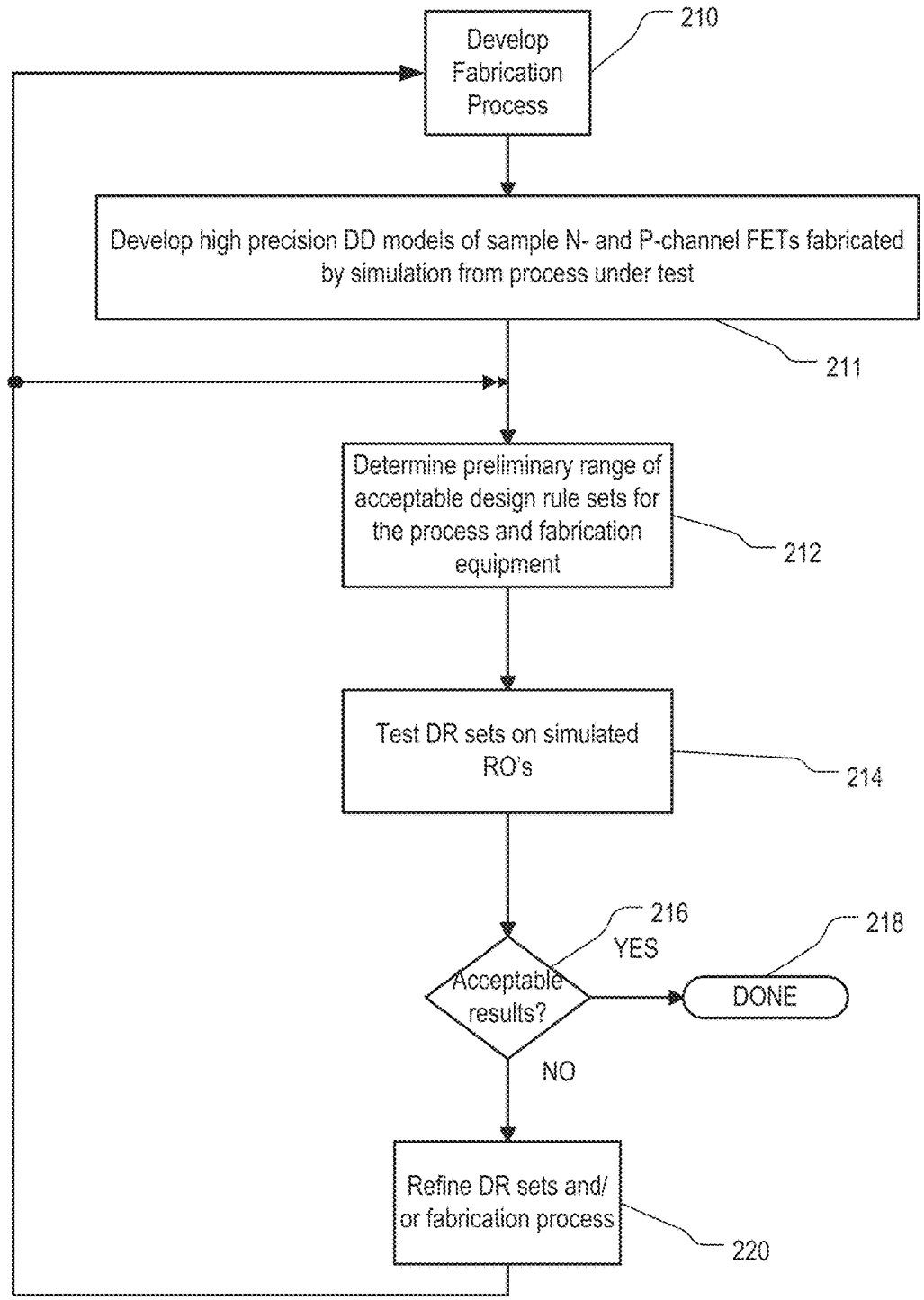
FIG. 2 is a flow chart of an overall method for developing a design rule set for a new or substantially changed fabrication process before the process has reached the point at which silicon devices can be fabricated reliably.

FIG. 2 is a flow chart of an overall method for developing a design rule set for a new or substantially changed fabrication process before the process has reached the point at which silicon devices can be fabricated reliably.

In step 210, the new fabrication process is developed, at least to the point of a basic sequence of process steps. Actual fabrication of structure is not required, and in fact may not yet be possible until needed fabrication equipment becomes available. In step 211, the system develops high precision but time- and expertise-intensive DD models of N- and P-channel FET transistors by simulation from the fabrication process under test. In step 212, a preliminary range of acceptable design rule sets are determined for the process and fabrication equipment. In a different embodiment, step 211 can be performed after or in parallel with the first iteration of step 212.

In step 214, a plurality of DRUTs are tested on simulated ROs.

In step 216, if one or more design rule sets have been found to yield acceptable results, then done (step 218). Otherwise in step 220, either the design rule sets are varied, or the fabrication process is tweaked, or both, in order to create a new plurality of design rule sets to test, and the process returns to step 212.

Figure 3:
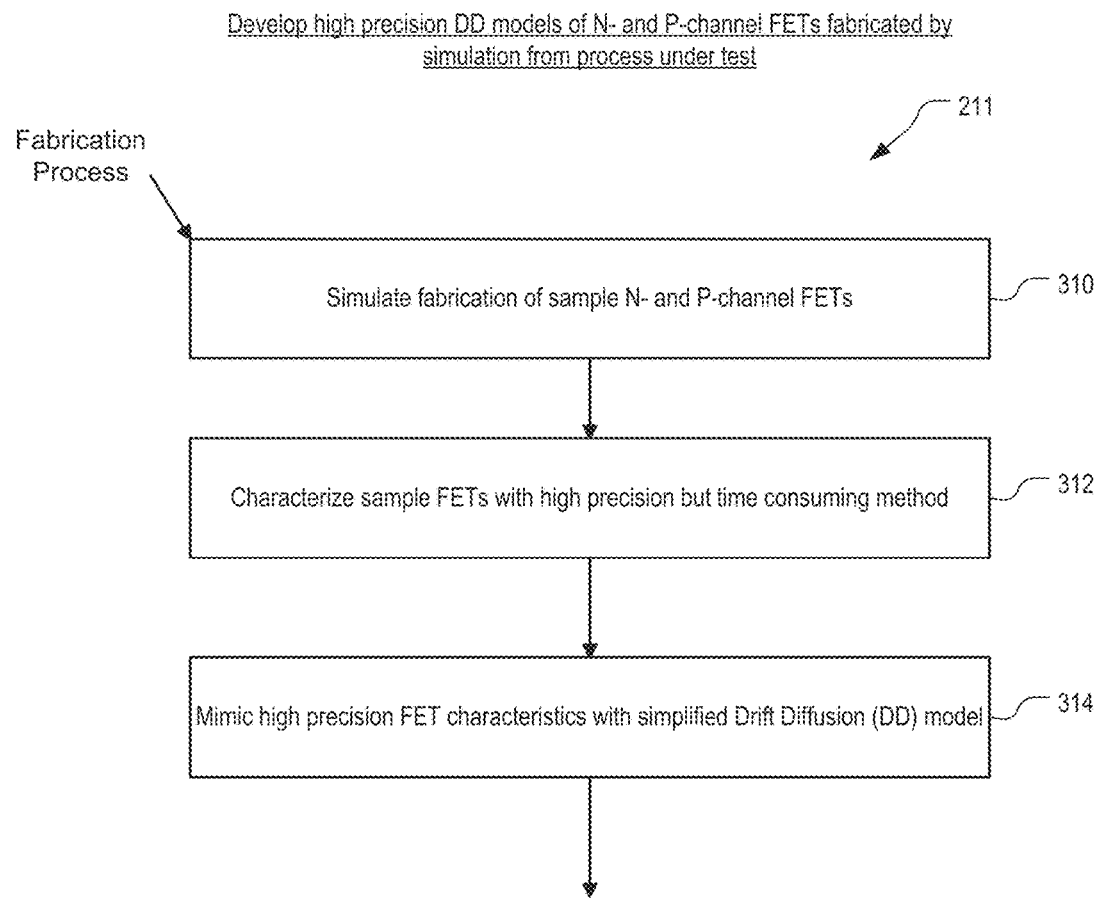
FIG. 3 is a flow chart detail of step 211 (FIG. 2).

FIG. 3 is a flow chart detail of step 211 (FIG. 2). This process performs a high precision simulation of sample transistors of each transistor type that is used in a stage of the RO, which in an embodiment are N- and P-channel FET transistors. This step is expensive to perform, in terms of time, computer power and expertise, but it need only be performed once to support much quicker evaluation of a large number of candidate DRUTs.

In step 310, the parameters of the current version of the fabrication process are used to simulate the fabrication of samples of each of the two kinds of transistors. Sentaurus Process, or another package that simulates the structures fabricated from a sequence of specified fabrication process steps, can be used for this purpose. The sample transistors are based on design rules that need not match any of the design rules to be tested, but they should preferably be within the range of design rule sets that will be evaluated in step 214, in order to ensure that the drift-diffusion models developed in step 211 remain valid. The output of step 310 is a file or database which identifies the geometries and material composition of each type of transistor. It may be represented as a three-dimensional mesh permeating the entire transistor body, which identifies the concentration of various materials at each node.

Semiconductor fabrication involves a series of process steps performed in a sequence that is defined in the fabrication process. The process steps are typically classified as Front End Of Line (FEOL) process steps such as formation of transistor source and drain regions and gate stacks, and formation of Shallow Trench Isolation (STI) regions; Middle of Line (MOL) process steps such as contacts to gates, sources and drains, and local interconnects below Metal 1; and Back End Of Line (BEOL) process steps such as opening vias in the interlayer dielectric, and the formation of multiple layers of interconnects at the Metal 1 layer and above, which connect the transistor contacts to each other and to other structures on the chip. The contacts to gates, sources and drains are not considered herein to be part of the "interconnects".

In step 312, the simulated sample transistor structures are characterized using a high precision though time consuming method, for example using an advanced transport model such as the non-equilibrium Green's function (NEGF) or the Boltzmann Transport equation. While the use of a high precision but time consuming method at this stage is most advantageous, it is not actually required in all embodiments of the invention. In some embodiments a low precision but quick method can be used to characterize the sample transistor structures. Preferably, though, the method used to characterize the sample transistors is of higher precision than the method used in step 314, below. The output of step 312 may for example be in the form of a file or database describing IV curves and CV curves that show currents and capacitances in response to applied biases.

More particularly, in some embodiments the advanced transport model is used to determine a database of IV curves, including their variation over time in response to a predetermined input stimulus at Vgs and Vds. These data are then further analyzed to calculate the CV curves, which are then added to the database.

In an embodiment in which the advanced transport model is based on the Non-Equilibrium Green's Function (NEGF), the drain current Id at a particular Vds and Vgs can be obtained by integrating the current density $\vec{J}(r,t)$ over the surface where the semiconductor meets the drain contact of the sample transistor structure, where $$\vec{J}(r, t) = \frac{e\hbar^2}{2m_0} \lim_{r' \to r} (\nabla_{r'} - \nabla_r) G^<(r, t; r', t).$$

In this equation, r and r' are positions in three-dimensional space in the transistor model, and $\vec{J}(r,t)$ is integrated over all r on the surface where the semiconductor meets the drain contact. $G^<$ is the lesser Green's function, and to obtain a steady state value of Id, the equation is evaluated in the limit at t→∞. To obtain a variety of IV curves for different values of Vds, the above equation is evaluated separately for each desired Vds, each with ramping values of Vgs. $G^<$ is a function of the electric field in the structure E(r,t), which is itself determined by solving coupled Poisson and Schrödinger equations on the geometry and materials profile of the transistor body. The contact biases Vds and Vgs desired for a particular point on the variety of IV curves are provided as boundary conditions on these equations.

In an embodiment in which the advanced transport model is based on the Boltzmann Transport equation, the same procedure as above are used to determine the IV and CV curves except that the current density $\vec{J}(r,t)$ is given by $$\vec{J}(r, t) = -e\Sigma_{n,\sigma} \int_{\hat{\Omega}} \frac{d^3k}{(2\pi)^3} f_{n\sigma}(r, k, t) v_n(k),$$

where the distribution function $$f_{n\sigma}(r, k, t) \frac{d^3 r d^3 k}{(2\pi)^3}$$

is defined as the number of electrons of spin σ in band n with positions within $d^3r$ of r and wavevectors within $d^3k$ of k at time t. The symbol $\hat{\Omega}$ below the integral in the above equation reminds that the wavevector integral is performed only over the first Brillouin zone. In addition, $$\frac{dr}{dt} = v_n(k) = \frac{1}{\hbar} \frac{\partial \varepsilon_n(k)}{\partial k} \text{ and}$$

$$\frac{dk}{dt} = -\frac{e}{\hbar} E(r, t) - \frac{e}{\hbar c} v_n(k) \times B(r, t).$$

n is the band index, and k is the wavevector. $\varepsilon_n(k)$ is the dispersion relation for band n, and is periodic with a period equal to any reciprocal lattice vector. $v_n(k)$ is velocity. E(r,t) is the electric field at each point r in the structure and B(r,t) is the magnetic field, which is assumed to be zero. As in the embodiment above in which the advanced transport model used is NEGF, E(r,t), is determined by solving coupled Poisson and Schrödinger equations on the geometry and materials profile of the transistor body. The contact biases Vds and Vgs desired for a particular point on the variety of IV curves are provided as boundary conditions on these equations.

Once IV and CV curves are determined for the sample transistor structures, in step 314, the system mimics the high precision transistor characteristics using a simplified drift-diffusion (DD) model such as is used in a Technology Computer Aided Design (TCAD) device simulator such as Sentaurus Device. This step may be performed for example by a curve fitting method, in which several parameters of the DD model are calibrated to match the IV and CV curves. The output of step 314 is a file or database which identifies the coefficients for the DD model to be used in the TCAD device simulator.

For example, in a drift-diffusion model such as that used in Sentaurus Device, the flow of species through the transistor is calculated based on the principle of conservation of mass within finite volumes around the nodes of a three-dimensional mesh that has been imposed on the model of the transistor structure. This results in continuity equations having the following form:

$$\frac{d}{dt} \int_{V(t)} C dV = \int_{V(t)} [g - l] dV - \oint_{S(t)} \vec{\Phi} \vec{n} dS,$$

where t is time; C is the concentration of the species (either atoms or electrons/holes); V(t) is the volume being considered (which can change over time); g is the generation of the species; l is the recombination of the species; S(t) is the area of the surface that encompasses the volume V(t); $\vec{\Phi}$ is the flux of the species across the surface S(t); and $\vec{n}$ is the outward facing normal to the surface S(t). Like the advanced transport models above, this equation can be used to calculate the current density $\vec{J}(r,t)$ within the transistor structure, which in turn can be integrated over the surface where the semiconductor meets the drain contact to calculate Id. $\vec{J}(r,t)$ depends on $\vec{\Phi}$, which in turn depends on the contact bias voltages Vds and Vgs applied as boundary conditions to the simulation. Thus like the advanced transport methods above, by evaluating the above equation separately for each desired Vds, each with ramping values of Vgs, a variety of IV curves for different values of Vds can be computed. And CV curves can be calculated as well from the IV curves in the manner described above.

The CV and IV curves calculated by simulation using the DD model will not exactly match those calculated by the advanced transport model, because though it is quicker it is also less precise. But the DD model contains certain parameters which can be adjusted so as to improve the match. In particular, in addition to depending on Vds and Vgs, $\vec{\Phi}$ also depends on certain "drift-diffusion parameters" such as mobility of the species under consideration, saturation velocity, and quantum separation. Quantum separation affects the CV curves, whereas mobility and saturation velocity affect the IV curves. So for a given value of Vds, the CV and IV curves previously determined for that value of Vds can be mimicked in the drift diffusion model by finding the best set of values for these drift-diffusion parameters.

Quantum separation is varied first in order to find the best-fit value for the CV curves, and then mobility and saturation velocity are varied in order to find the best-fit value for the IV curves. Typically a single set of the drift-diffusion parameters are found which best fit all of the IV and CV curves. These are standard curve fitting exercises. The resulting best-fit values for the drift-diffusion parameters form the output of step 314.

Figure 4:
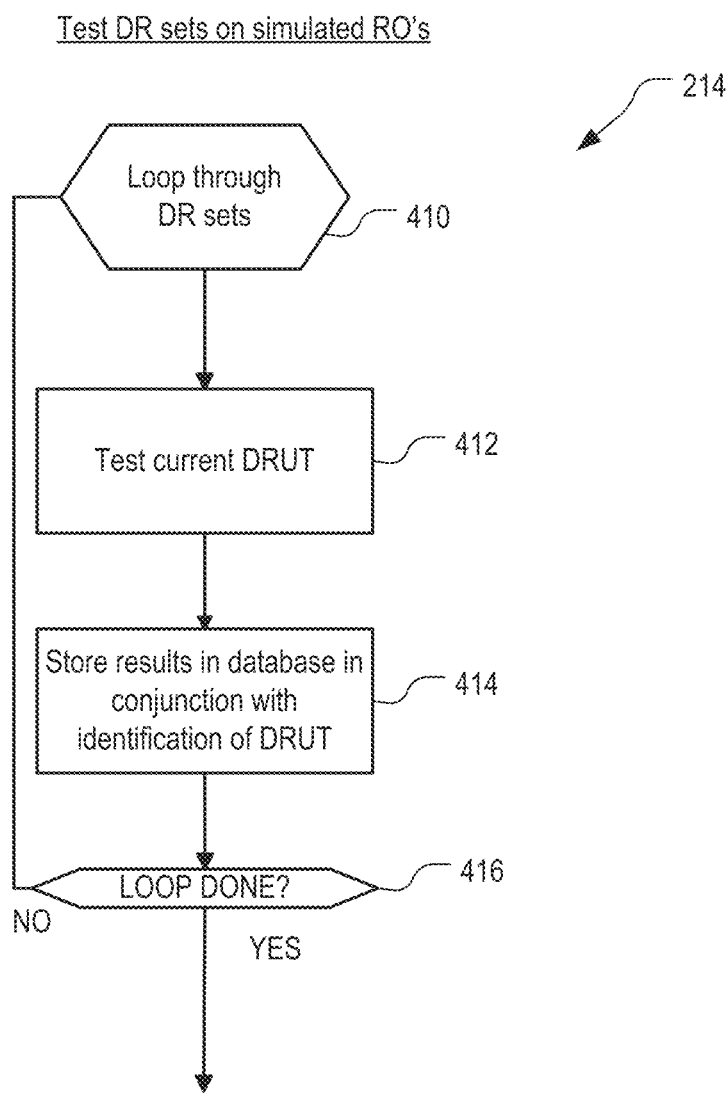
FIG. 4 is a flow chart of step 214 for testing design rule sets on simulated RO's.

FIG. 4 is a flow chart of step 214 for testing design rule sets on simulated RO's. The FIG. 4 example is a sequential embodiment, which can be used on a single computer system. The sequence of steps in FIG. 4 are preferably arranged in a script which is executed by a control process of the computer system. Sentaurus Workbench, from Synopsys, Inc., can be used to operate the script.

In step 410 the system begins a loop through the design rule sets that have been previously found to produce acceptable yield. In step 412 the current DRUT is evaluated as described hereinafter, and in step 414 the results are stored in a database in conjunction with an identification of the particular DRUT. In step 416, the system returns to step 410 to evaluate the next DRUT. This process can be stopped or paused as needed, or the sequence of design rules to be tested can be altered, for example in dependence upon the results of previously tested DRUTs.

Figure 5:
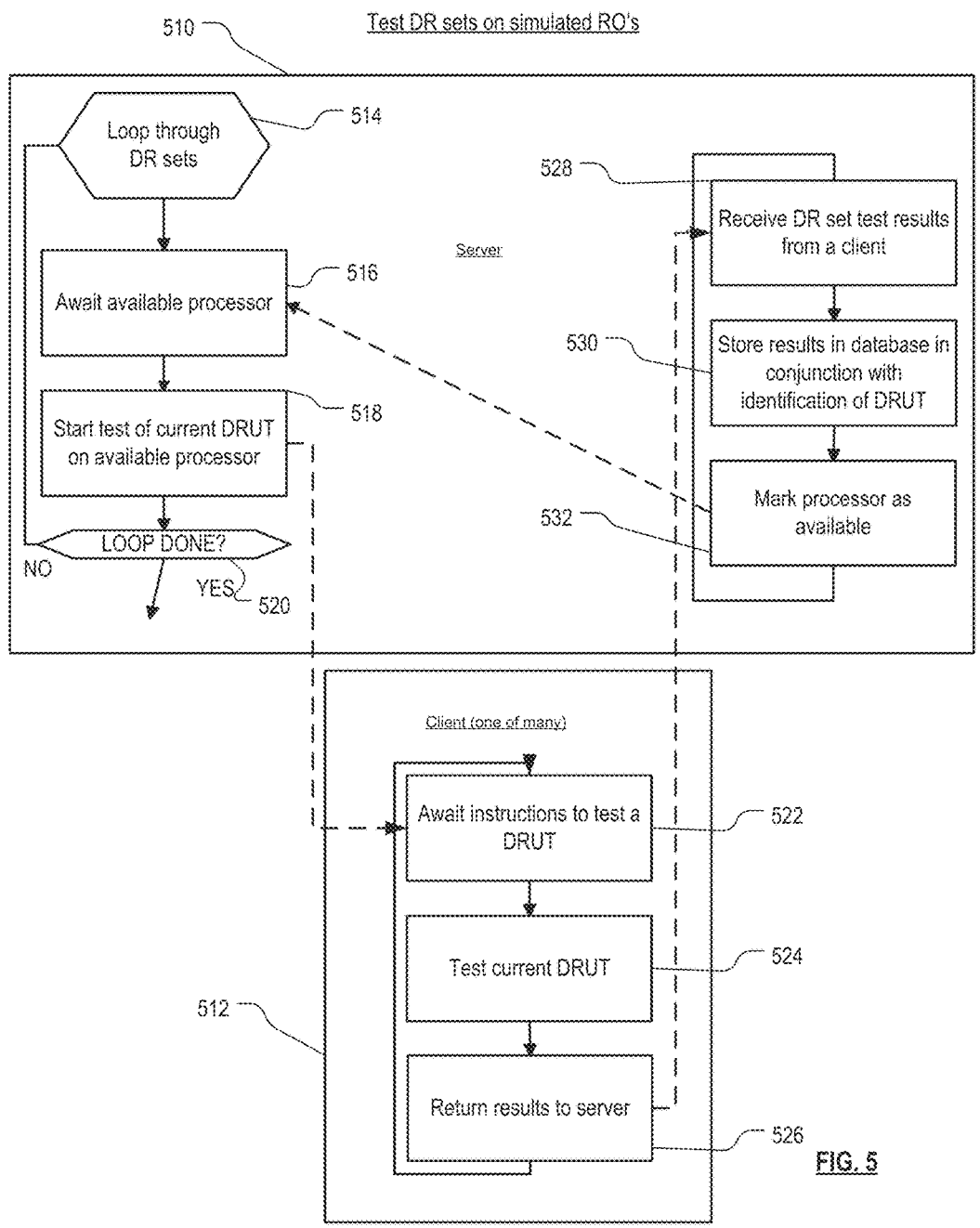
FIG. 5 illustrates another embodiment of step 214 for testing design rule sets on simulated RO's in parallel in a client/server arrangement.

FIG. 5 illustrates another embodiment of step 214 for testing design rule sets on simulated RO's in parallel in a client/server arrangement. It includes a server 510 and a number of client computer systems or processor cores 512. The sequences of steps executed by the server in FIG. 5 are preferably arranged in one or more scripts which are executed by a control process of the server. Similarly, the sequence of steps executed by the client in FIG. 5 is preferably arranged in one or more scripts which are executed by a control process of the client. Again, Sentaurus Workbench can be used to operate these scripts.

In step 514 the server begins a loop through the design rule sets that have been previously found to produce acceptable yield. In step 516, the server awaits an available client processor or processor core. In step 518, the server transmits appropriate instructions and data to the available client processor for testing the current DRUT. In step 520, if there are more design rule sets to test, the server returns to step 514 to instruct evaluation of the next one.

A client processor or processor core 512, in step 522, awaits instructions from the server 510 to test a DRUT. In step 524 it evaluates the current DRUT in the manner hereinafter described, and in step 526, it returns the results of the evaluation to the server 510. The server, in step 528, receives the DR set test results from a client, and in step 530 stores the results in a database in conjunction with an identification of the DRUT. In step 532 the client processor which provided the results is marked as available, so that it can be re-used in a future iteration of step 516.

Steps 412 and 524 both recite testing the current DRUT. In conventional techniques, the performance of a (single) transistor is often predicted by building a BSIM compact model of the transistor and introducing its response to proximity effects through SPICE instance parameters based on look-up tables. This is a very time consuming approach. In embodiments herein, by contrast, transistors are modeled simultaneously with parasitic resistance and capacitance by performing a device simulation of an entire logic cell. Any of a variety of logic cell types can be used, such as an inverter, a buffer, or a cell which performs a more sophisticated logic function. Such a cell typically includes more than just one transistor under test: it also can include additional transistors, source, drain and gate contacts for each included transistor, metal interconnects among transistors and other features, nearby oxide filled trenches, other transistors nearby, isolation trenches cutting longitudinally-adjacent fin segments, and so on. These additional aspects can affect stress in the transistor channel, resistance and capacitance as well as a range of other phenomena, all of which can affect transistor performance in significant and sometimes surprising ways. Embodiments described herein use an inverter as the logic cell, because it includes many of the above features.

Figure 9:
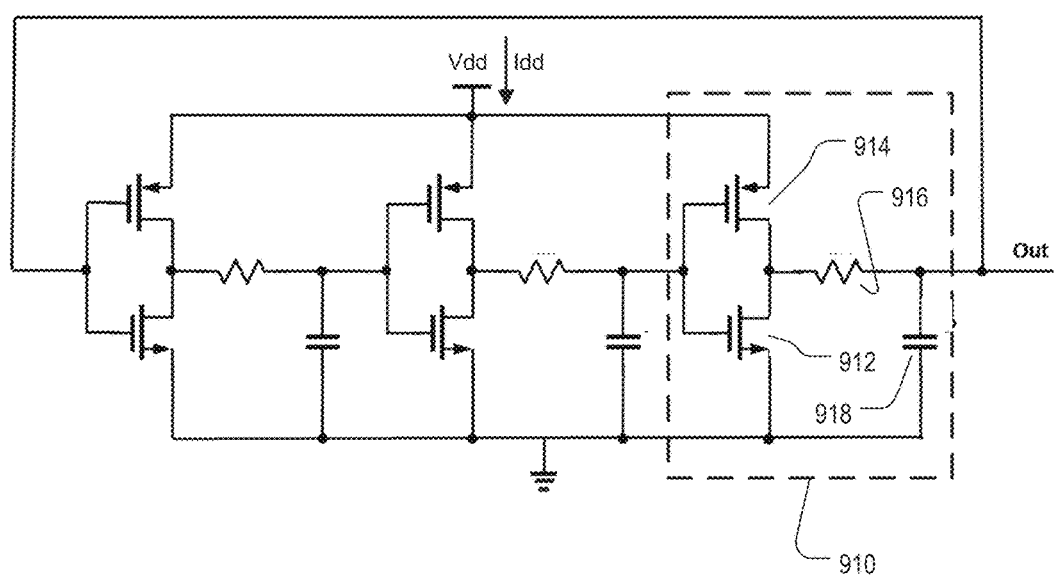
FIG. 9 illustrates a circuit schematic of a typical ring oscillator having three inverting stages, that may be used in the simulation of FIG. 6.

In addition, preferably but not necessarily, the performance of the inverter is evaluated by connecting (by simulation) an odd number of the inverters in a ring to form a ring oscillator. A ring oscillator is a device having an odd number of inverting stages. The stages are connected in a chain, and the output of the last stage is fed back into the first. FIG. 9 illustrates a circuit schematic of a typical ring oscillator having three inverting stages, that may be used in the simulation of FIG. 6. One stage is identified in the drawing by broken line 910. It comprises an N-channel transistor 912 and a P-channel transistor 914 connected together as a CMOS inverter. The stage also shows parasitic output resistance 916 and capacitance 918. The output of each stage is connected to the input of the next stage, and the output of the last stage loops back to connect to the input of the first stage. The overall output of the RO can be taken from the output of any of the individual stages.

In the embodiment of FIG. 9, each stage is a logical inverter. However other circuit elements can be used in other embodiments. In one embodiment each stage is a NAND or NOR gate, each with two or more inputs all of which are tied together. In another embodiment, not all the stages are identical. In another embodiment one or more of the stages also includes one or more non-inverting elements, which do not count in determining whether the total number of inverting stages is odd. In another embodiment, one or more of the stages include a second input. In the embodiment of steps 412 and 524, the ring oscillator structure is chosen such that all the stages are inverting and all are identical. If a different type of ring oscillator is used for the simulation, then the implementation of the steps 412 and 524 are adapted accordingly.

The performance of a CMOS pair of transistors in a more nearly realistic environment can then be evaluated simply by observing the ring oscillator in simulated operation. "Performance" of a logic cell, as the term is used herein, includes indications of switching delay and/or power consumption of the logic cell. It may include indications of other qualities as well. The average switching delay of a cell in a ring oscillator can be predicted by allowing the ring oscillator to switch through N complete oscillations, dividing the time T required to complete the N oscillations by 2*N, and further dividing the result by the number of stages in the ring oscillator. This provides the per-stage switching speed of a cell, averaged over both pull-up and pull-down transitions. (Equivalently, the average switching delay of a cell can be predicted by allowing the ring oscillator to oscillate for a period of time T, and observing the number N of oscillations completed during that time. Either formulation can be described as determining the switching speed in dependence upon the observed frequency of oscillation of the ring oscillator.)

Similarly, the power consumption of the cell can be predicted by observing Idd (the current flow from the power supply) and Vdd over the total oscillation time T, integrating Idd×Vdd over the time T, and dividing the result in the same way. This provides the per-stage power consumption of a cell, averaged over both pull-up and pull-down transitions. Note that the performance of an inverter stage in a ring oscillator environment will not necessarily match the performance of any particular transistor or inverter in a production circuit with a different layout. But for the purposes of evaluating design rule sets it is not critical that the performance observed be correct in an absolute sense. The intent is that the performance observation be correct in a relative sense, so that the performance numbers from different design rule sets can be compared to each other to find an optimum design rules set.

Figure 6:
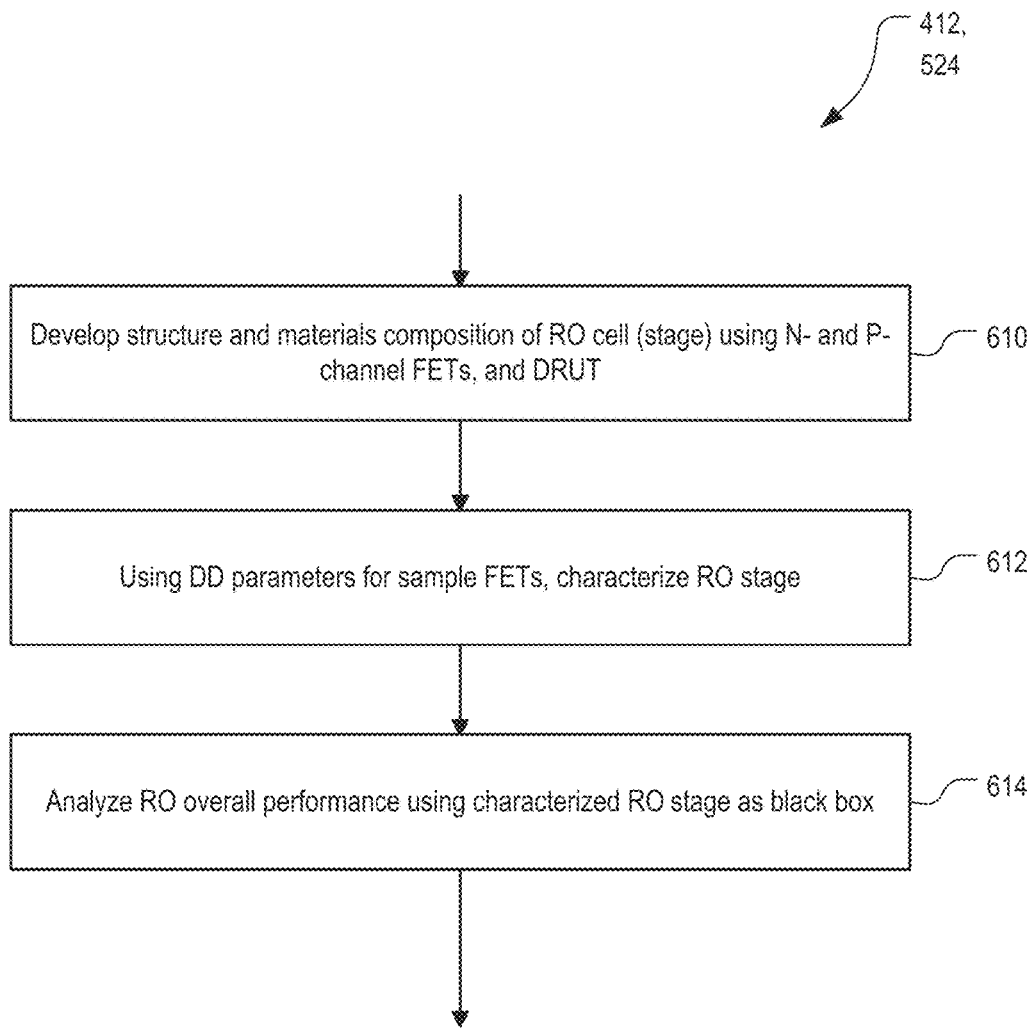
FIG. 6 is a flow chart detail of both steps 412 and 524 for testing a particular one of the DRUTs.

FIG. 6 is a flow chart detail of both steps 412 and 524 for testing a particular one of the DRUTs. This step can be performed many times on numerous candidate DR sets, because it is not time consuming. In step 610, the structure and materials composition of an RO cell (stage) is developed by simulating its fabrication and using the particular DRUT. This step is described in more detail below with respect to FIG. 7. In step 612, using the transistor DD models previously developed in step 211, and using the circuit interconnects by which the transistors are interconnected to form an RO stage, a single RO stage is characterized by simulation. While TCAD products can be stretched to handle a small library cell like inverter or NAND or part of a large library cell like flip-flop, they cannot feasibly handle an entire RO with tens or even hundreds of stages. This step 612 uses TCAD to develop a "black box" behavioral model of one RO stage, and then uses such black box model for RO analysis. The "black box" can be developed using a TCAD program such as Sentaurus Device, which can model currents in BEOL based on the above-determined DD parameters, and can also model the impact of mechanical stress for each transistor in the structure. Optical proximity effects can be accounted for through GDS by applying OPC tools to original GDS masks. Parasitic capacitances can be included by combining the Poisson equation with continuity equations in a transient simulation mode (e.g. calculating currents and biases changing over time). Also, as can be seen, instead of trying to build BSIM compact models of the transistors and creating its response to proximity effects through SPICE instance parameters based on look-up tables, steps 610 and 612 together model transistors simultaneously with parasitic RC in a device simulation of the entire RO stage.

As used herein, a "black box" is a circuit component which is defined only by its behavior at its output(s) in response to signals applied to its input(s). No information is needed about the internal structure or circuitry of the circuit component. Thus it is not restricted to common individual circuit components such as resistors, capacitors and transistors. It can incorporate other components, as well as combinations of components.

In step 614, the overall performance of a complete, multistage RO, is characterized using the RO stage as a black box having the circuit characteristics determined in step 612. The Synopsys, Inc. "SABER" product can be used for this purpose. SABER is described for example in Mantooth, H. Alan, and Martin Vlach, "Beyond SPICE with SABER and MAST", Circuits and Systems, 1992. ISCAS'92. Proceedings, 1992 IEEE International Symposium on. Vol. 1. IEEE, 1992, incorporated by reference herein.

Figure 7:
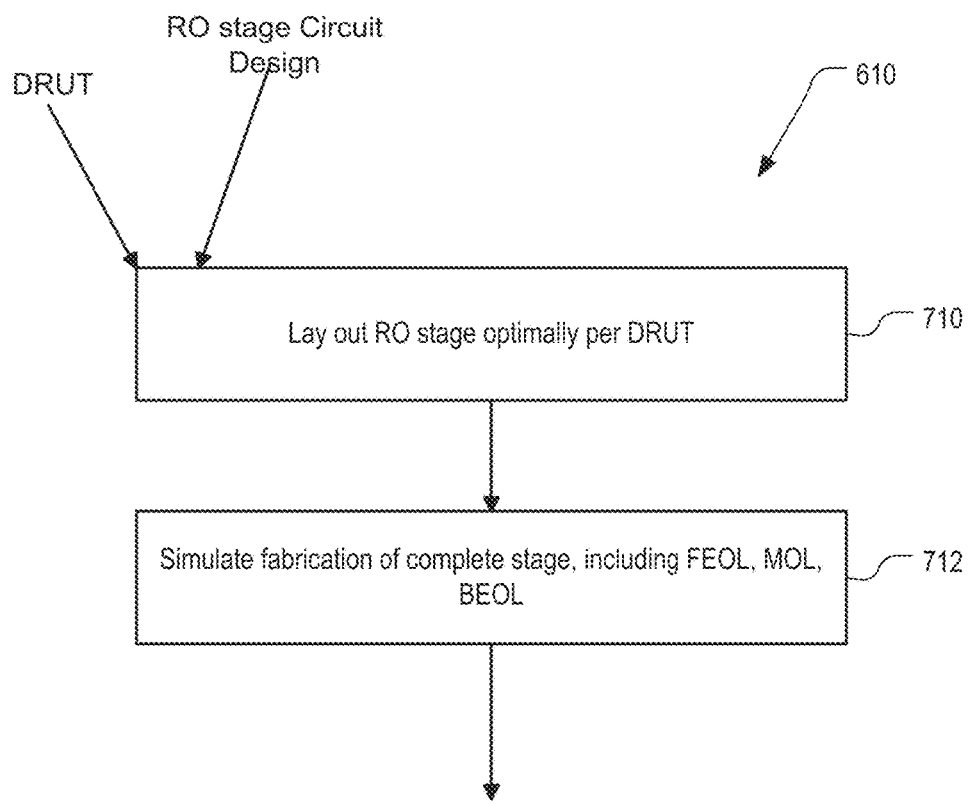
FIG. 7 is a flow chart detail of step 610 for developing the structure and materials composition of an RO stage using N- and P-channel FETs, and DRUT.

FIG. 7 is a flow chart detail of step 610 for developing the structure and materials composition of an RO stage using N- and P-channel FETs, and DRUT. In step 710 the RO stage is laid out optimally using the RO stage circuit design and the current DRUT. Custom Designer, available from Synopsys, Inc., can be used for this purpose. In step 720, the fabrication of a complete RO stage is simulated, including FEOL, MOL and BEOL. A TCAD fabrication process simulator such as Sentaurus Process can be used for this purpose.

Figure 10:
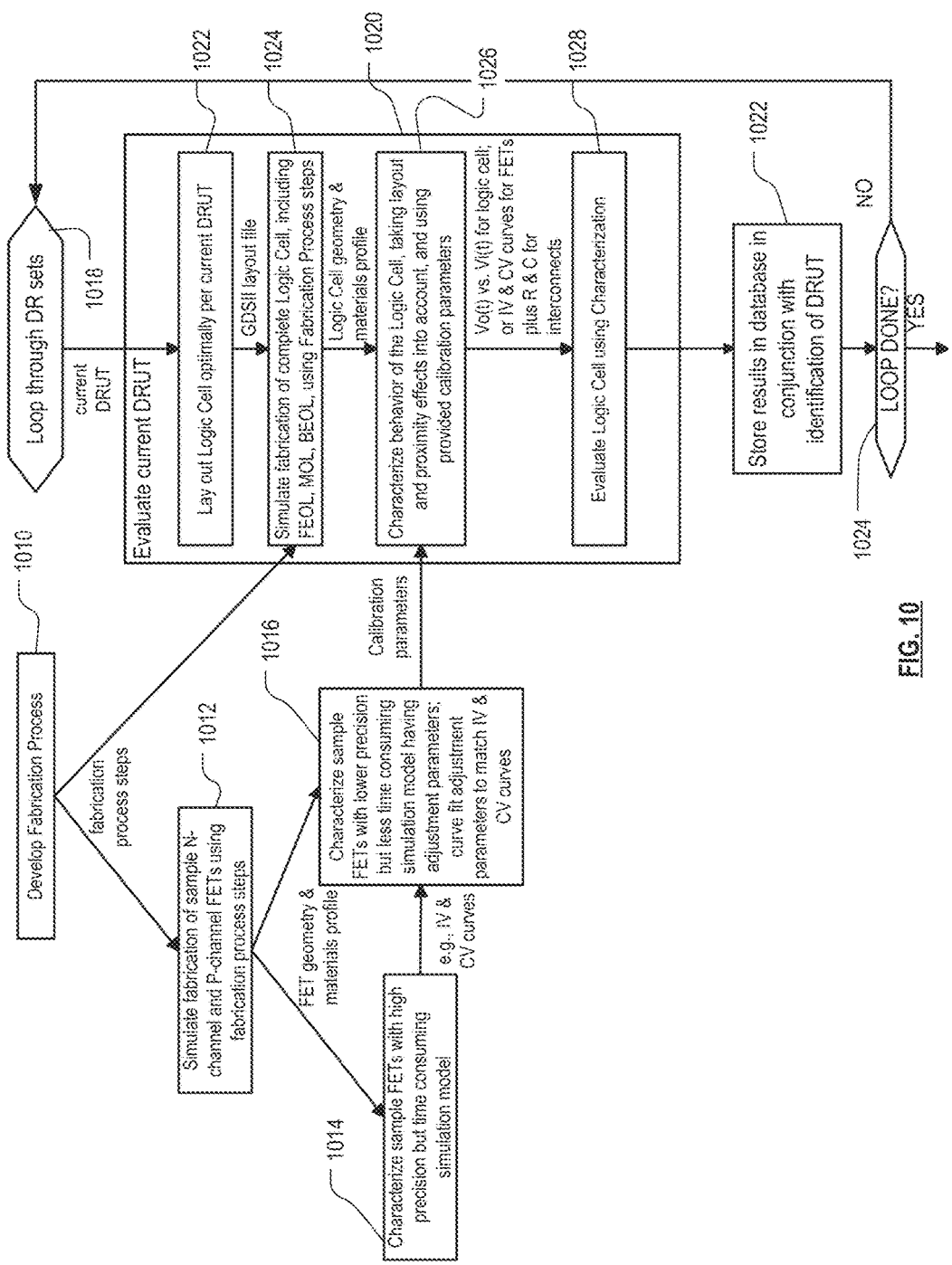
FIG. 10 is another view of certain embodiments of the invention.

FIG. 10 is another view of certain embodiments of the invention. Many of the boxes illustrated in FIG. 10 are sometimes referred to herein as modules rather than process steps, because typically they will be implemented with separate software products. Much of the process can be automated using an appropriate scripting language such as Synopsys Workbench. Preferably, at least the entire Loop 1018 (including all its contents) can be scripted and/or executed using either the embodiment of FIG. 4 or the embodiment of FIG. 5.

Referring to FIG. 10, in step 1010, a tentative fabrication process is developed. The fabrication process is defined by a series of fabrication process steps. These are provided to a fabrication simulation module 1012, which uses them to simulate the fabrication of sample N-channel and P-channel FETs. As mentioned, this module can include an instance of "Sentaurus Process", available from Synopsys, Inc. The output of module 1012 includes the geometry of each of the two kinds of FETs, including the profile (composition) of materials that they contain. For example, the output may be provided as a database describing a three-dimensional mesh permeating the transistor body, with each node in the mesh having associated therewith an indication of the quantity and concentration of various materials within a volume that encloses the node. The materials composition includes a dopant profile, since some of the materials in the materials profile are dopants.

The geometry and materials profile from module 1012 for each of the sample transistors is provided to a high precision but time consuming FET characterization module 1014. As mentioned, a module which bases its analysis on an advanced transport model such as the non-equilibrium Green's function (NEGF) or the Boltzmann Transport equation can be used in module 1014. Other advanced transport models that can be used are described in Grasser, et. al., Advanced Transport Models for Sub-Micrometer Devices, in "Proceedings of the 9th International Conference on Simulation of Semiconductor Processes and Devices (SISPAD)", Springer, (2004), and in Palestri, et. al., Comparison of advanced transport models for nanoscale nMOSFETs (2009), both of which are incorporated by reference herein. The output of module 1014 may for example be in the form of a file or database describing IV curves and CV curves that show currents and capacitances in response to applied biases for each of the FET types.

The high precision characterizations of the sample FETs are provided to another characterization module 1016, which also receives the FET geometries and materials profiles from module 1012. Characterization module 1016 preferably uses a lower precision but speedier method of characterizing the FETs. For example, it can use a DD model and can include an instance of Sentaurus Device, available from Synopsys, Inc. Module 1016, like module 1014, characterizes the sample FETs to generate IV and CV curves, but then calibrates these to the IV and CV curves from module 1014 by adjusting certain DD parameters such as mobility, saturation velocity, and quantum separation. These adjustment parameters are referred to herein as calibration parameters. Essentially, now, the speedier characterization module 1016 has now been calibrated to the higher precision module output, so that the speedier model can now be used in place of the higher precision model for fast yet relatively accurate characterization of other transistors which are similar but not identical to the sample transistors.

The determination of the calibration parameters in module 1016 involves determining calibration parameters for the secondary simulation model such that a characterization of the sample FET structure by the second simulation module yields "substantially" the same set of at least one IV or CV curve as determined by the first simulation model. As used herein, the question of how similar the IV/CV curves must be in order to be "substantially" the same will depend on the embodiment. In one embodiment, a minimization function is used to find the calibration parameter values which yield a minimum (by some predetermined definition) deviation between the IV/CV curves generated by the second simulation model as compared to those generated by the first. In such an embodiment the IV/CV curves are considered "substantially" the same. In another embodiment, various values are tried for the calibration parameters, until a set of values is found for which the IV/CV curves generated by the second simulation model are "sufficiently similar" to those generated by the first simulation model, according to some predetermined definition of "sufficiently similar"; and then the search aborts. In such an embodiment the IV/CV curves which are "sufficiently similar" are considered "substantially" the same. Other ways of evaluating "substantial" similarity will be apparent to the reader.

While characterization module 1016 uses a higher speed but lower precision simulation model than that of characterization module 1014, this is not actually required in all embodiments of the invention. In some embodiments a low precision but high speed simulation model can be used in module 1014. Preferably, though, the module used to characterize the sample transistors uses a lower speed and/or higher precision model than that used in module 1016. More particularly, if both modules are used to characterize the same transistor, the module 1016 will finish more quickly than the module 1014. Additionally or alternatively, the module 1014 will produce more accurate results than the module 1016. The simulation model used in module 1014 is sometimes referred to herein as the "primary" model, and the simulation model used in module 1016 is sometimes referred to herein as the "secondary" model.

Once the speedier module 1016 has been calibrated, a loop 1018 begins through a plurality of candidate sets of Design Rules Under Test (DRUT). Each current DRUT is evaluated in step 1020, and in step 1022 the results are written to a database in association with an identification of the current Design Rule Under Test (DRUT). In step 1024 the routine then loops back to step 1018 to evaluate the next candidate DRUT.

Module 1020, for evaluating the current DRUT, begins with step 1022 for laying out a predetermined logic cell optimally per the current DRUT. Astro and IC Compiler are two products available from Synopsys, Inc. that can be used to perform this step. These products take a circuit design as input, typically in the form of a netlist. In the case of step 1022 the circuit design is the predetermined logic cell, such as the circuit portion 910 in FIG. 9. These products generate as output a layout file that indicates, among other things, all the geometric shapes that are to be written to lithographic masks for the fabrication of an integrated circuit that implements the circuit design. The layout can be provided in a standard layout description database format, such as GDS-II or OASIS. It is not essential that the layout be optimal in the sense that absolutely no better layout exists that meets the DRUT, only that an effort be made to take full advantage of the rules in the DRUT, and that the effort is similar for each DRUT. This can be accomplished by using the same tool (e.g. IC Compiler), with the same or similar configuration settings, for all of the DRUTs to be compared.

Module 1024 simulates the fabrication of the complete logic cell from the layout database, including FEOL, MOL and BEOL portions, using the same fabrication process steps from step 1010 that were used in module 1012. Again, a fabrication process simulator such as Sentaurus Process, available from Synopsys, Inc., can be used in module 1024. The output of module 1024 includes the geometry and materials profile of the entire logic cell 910, not merely one transistor. This output may be provided as a database describing a three-dimensional mesh permeating the entire body, including the transistors and all interconnect layers, with each node in the mesh having associated therewith an indication of the quantity and concentration of various materials within a volume that encloses the node.

The output database is provided to characterization module 1026, which characterizes the behavior of the entire logic cell, taking layout and proximity effects into account. The FETs in the logic cell as well as the interconnects, are included in the logic cell characterization in module 1026. When characterizing portions of the logic cell body which form the FETs, the module uses the calibration parameters from characterization module 1016. In contrast to the "primary" and "secondary" simulation models used in modules 1014 and 1016, the simulation model used in module 1026 is sometimes referred to herein as an "operational" simulation model.

In one embodiment, the same lower precision but less time consuming simulation model as is used as the "secondary" simulation model in module 1016 can be used also as the "operational" simulation model in module 1026. For example, if a DD model is used in module 1016, then the calibration parameters from step 1016 in addition to the effects arising from the specific layout, are taken into account in the continuity equations for mesh nodes within each transistor body in module 1026; the interconnects are characterized also using the DD model, though the calibration parameters are not required for this aspect of the characterization. The output of module 1026 in this embodiment characterizes the entire logic cell in the current layout as a black box, including the effects of the interconnects. For example the output may be provided in the form of a database that describes the voltage Vo(t) at the output of the logic cell, in response to a variety of different rate positive and negative ramps of the voltage Vi(t) at the input of the logic cell, for a variety of different loads connected to the output of the logic cell.

In another embodiment, a circuit simulator such as HSPICE, available from Synopsys, Inc., is used as the "operational" simulation model in module 1026, instead of a DD model as is used in module 1016. In this case a normal or default HSPICE model for an FET can be modified with the calibration parameters from module 1016, and then further adjusted to account for proximity effects arising due to the layout from step 1022. Interconnects are characterized separately, also taking proximity effects into account, to yield resistance and capacitance values for each interconnect. Such characterization can be accomplished using a 3D Poisson or Laplace equation solver, for example using the tool Raphael, available from Synopsys, Inc. Alternatively or additionally, the tool STAR RCXT, also available from Synopsys, Inc., can be used. The output of module 1026 in this embodiment includes the IV and CV curves for the FETs in the current layout, plus the resistance and capacitance of the interconnects in the current layout.

Next, module 1028 evaluates the logic cell by simulation using the logic cell characterization information from module 1026. As mentioned, if the logic cell is inverting, then its performance can be evaluated in a simulated ring oscillator. All transient effects are encapsulated in the logic cell characterization, and so average switching delay of the cell can be evaluated by observing the time T required to complete N oscillations at the ring oscillator output, and power consumption of the cell can be evaluated by integrating Idd×Vdd over the total oscillation time T. These performance characteristics are written to the DRUT Performance database in step 1022.

In another embodiment, module 1028 evaluates the logic cell instead merely by applying by simulation a rising edge and/or a falling edge to the input of the logic cell, and observing the simulated output behavior of the logic cell in response. For example, switching delay of the logic cell can be evaluated by detecting how long it takes for the output to transition beyond some predetermined output value after the applied input voltage transitions beyond some predetermined input voltage. Similarly, power consumption can be evaluated by integrating Idd×Vdd over some predetermined time period beginning no later than the beginning of the input voltage transition and ending no earlier than the end of the output transition.

After a sufficient number and variety of candidate DRUTs are evaluated, the set of design rules that is considered to be the best is then used either to further improve the fabrication process, or to provide to designers so that they can begin developing products using the new fabrication process even before the fabrication process is ever used to fabricate a chip.

Computer System

Figure 8:
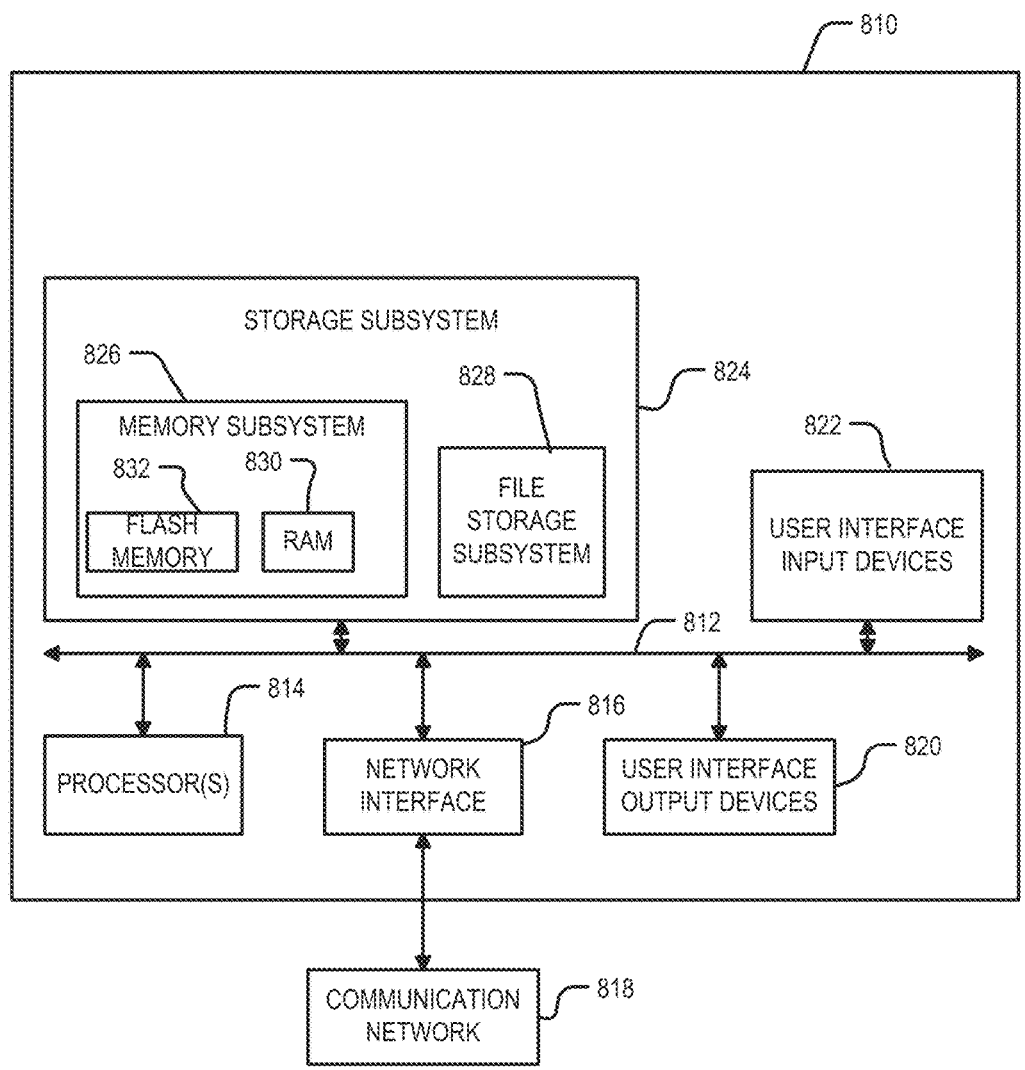
FIG. 8 is a simplified block diagram of a computer system 810 suitable for use with embodiments of the technology.

FIG. 8 is a simplified block diagram of a computer system 810 suitable for use with embodiments of the technology. For example, each of the individual simulation and other tools mentioned herein, as well as the systems of FIGS. 4 and 5 may be implemented using one or more computer systems 810. Computer system 810 typically includes at least one processor 814 which communicates with a number of peripheral devices via bus subsystem 812. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810. Network interface subsystem 816 provides an interface to outside networks, including an interface to communication network 818, and is coupled via communication network 818 to corresponding interface devices in other computer systems. Communication network 818 may comprise many interconnected computer systems and communication links. These communication links may be wireline links, optical links, wireless links, or any other mechanisms for communication of information. While in one embodiment, communication network 818 is the Internet, communication network 818 may be any suitable computer network.

User interface input devices 822 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 810 or onto communication network 818.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 810 to the user or to another machine or computer system. Visualizations of quantities determined by the techniques herein may be presented on some of these output devices.

Storage subsystem 824 stores the basic programming and data constructs that provide the functionality of some or all of the embodiments described herein. These software modules are generally executed by processor 814, to implement the logic of the methods described herein.

Memory subsystem 826 typically includes a number of memories including a main random access memory (RAM) 830 for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD-ROM drive, an optical drive, or removable media cartridges. The files and databases mentioned herein, as well as modules implementing the functionality of certain embodiments, may be stored by file storage sub system 828.

Bus subsystem 812 provides a mechanism for letting the various components and subsystems of computer system 810 communicate with each other as intended. Although bus subsystem 812 is shown schematically as a single bus, alternative embodiments of the bus subsystem may use multiple busses.

Computer system 810 itself can be of varying types including a personal computer, a portable computer, a workstation, a computer terminal, a network computer, a television, a mainframe, or any other data processing system or user device. Due to the ever-changing nature of computers and networks, the description of computer system 810 depicted in FIG. 8 is intended only as a specific example for purposes of illustrating the preferred embodiments. Many other configurations of computer system 810 are possible having more or less components than the computer system depicted in FIG. 8.

Incorporated Material

The following documents are incorporated by reference and also attached hereto and form part of the present application:

U.S. patent application Ser. No. 13/507,310 (Guoy et.al., Moving Mesh System and Method For Finite Element/ finite Volume Simulations, for its teachings regarding the simulation of fabrication processes) (SYNP 1796-1);

U.S. patent application Ser. No. 14/479,070 (Moroz et.al., Atomic Scale Grid for Modeling Semiconductor Structures and Fabrication Processes, for its teachings regarding the simulation of fabrication processes) (SYNP 2474-1)

U.S. Pat. No. 7,302,375 (Kucherov et.al., Simulation Of Processes, Devices and Circuits By A Modified Newton Method, for its teachings regarding simulation of processes, devices and circuits) (SYNP 0554-1)

U.S. Pat. No. 8,407,634 (Moroz, et. al., Analysis Of Stress Impact On Transistor Performance) (SYNP 0693-1) for its description of certain compact models of transistors for use by circuit simulation modules.

Luisier, M., Quantum Transport Beyond the Effective Mass Approximation, dissertation (2007) (for its teachings regarding NEGF);

Arovas, D., Boltzmann Transport, UC San Diego, Chapter 1 of Physics 211B Lectures and Reading, http://physics.ucsd.edu/students/courses/winter2010/physics211b/LECTURES/CH01.pdf (visited 2016 Jul. 30)

Mantooth, H. Alan, and Martin Vlach. "Beyond SPICE with Saber and MAST." Circuits and Systems, 1992. ISCAS'92. Proceedings, 1992 IEEE International Symposium on. Vol. 1. IEEE, 1992. (for its teachings regarding SABER)

Synopsys, Data Sheet, Sentaurus Workbench—Comprehensive Framework Environment (2005)

SUMMARY

The above approach for developing design rule sets for a new or substantially changed fabrication process can be performed with reasonable accuracy before actual silicon data is available and then fine-tuned as soon as reliable silicon data becomes available. The modeling methodology also can be automated so that a non-expert user can run it. Run time for the above approach permits going from an idea about changing one or several particular design rules to having its impact on RO performance predicted, can be very quick, because the high precision but time consuming portion of the analysis is performed in advance and re-used for each new version of the design rule set to be evaluated. It need not be done more than once upfront and then included into the automated tool flow. Thus pre-silicon evaluation of design rule choices can be performed relatively quickly, and it can be done in a massively parallel way to build a Design Of Experiments (DOE). Thus adopting this methodology can considerably improve performance-power-area of a technology by achieving better set of design rules.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The databases mentioned herein are stored in a non-transitory manner on one or more computer readable media. As used herein, no distinction is intended between whether a database is disposed "on" or "in" a computer readable medium. Additionally, as used herein, the term "database" does not necessarily imply any unity of structure. For example, two or more separate databases, when considered together, still constitute a "database" as that term is used herein.

The logic of many of the steps of the flow charts herein can be implemented using processors programmed using computer programs stored in memory accessible to the computer systems and executable by the processors, by dedicated logic hardware, including field programmable integrated circuits, or by combinations of dedicated logic hardware and computer programs. Each such block in the flowcharts describes logic that can be implemented in hardware or in software running on one or more computing processes executing on one or more computer systems. In one embodiment, each such step of the flow charts illustrates the function of a separate module of software. In another embodiment, the logic of the step is performed by software code routines which are distributed throughout more than one module. As with all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas the logic cell used for characterization purposes herein may be an inverter, or another circuit which performs a logical inversion function, another embodiment can use circuits which perform other kinds of logic functions. For example, some embodiments can use a non-inverting buffer. Note that in such an embodiment it may not be necessary to characterize FETs of both conductivity types. Therefore, in one embodiment, an FET of only one conductivity type (N-channel or P-channel) is characterized.

Without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

The invention claimed is:

1. A method for developing a set of design rules for a fabrication process, comprising:
   for each given one of a plurality of candidate design rule sets for the fabrication process, a computer system developing a layout of a logic cell in dependence upon the given design rule set, the logic cell having an input and an output and having at least a first transistor and at least a first interconnect connected to the first transistor, a computer system simulating fabrication of the logic cell according to the fabrication process and the layout, to derive a 3-dimensional model of the logic cell structure, the logic cell structure identifying geometry and materials composition of at least the first transistor and the first interconnect in the logic cell structure, a computer system characterizing by simulation behavior of the logic cell structure, including characterizing the combined behavior of both the first transistor and the first interconnect, a computer system evaluating performance of the logic cell structure in dependence upon the behavior as characterized;

a computer system recording in a database on one or more computer readable media, in association with an indication of the given set of design rules, a set of one or more values indicating performance of the logic cell; the database being accessible to a user for use in optimizing the design rule sets for the fabrication process; and using the data recorded in the database as a basis for optimizing the design rule sets for the fabrication process.

2. The method of claim 1, wherein evaluating performance of the logic cell structure comprises observing by simulation transient behavior at an output of a black box component having the behavior characterized in the step of characterizing, in response to voltage changes at an input of the black box component.

3. The method of claim 1, wherein the logic cell includes both an N-channel FET and a P-channel FET.

4. The method of claim 1, wherein the logic cell performs a logical inversion function, and wherein evaluating performance of the logic cell structure in dependence upon the behavior as characterized comprises simulating operation of a ring oscillator having an odd number of stages, each of the stages being an instance of the logic cell structure.

5. The method of claim 4, wherein evaluating performance of the logic cell structure further comprises determining a performance characteristic of the logic cell in dependence upon the frequency at which the ring oscillator oscillates in the simulated operation of the ring oscillator.

6. The method of claim 5, wherein the performance characteristic of the logic cell includes switching delay.

7. The method of claim 4, wherein evaluating performance of the logic cell structure further comprises determining a performance characteristic of the logic cell in dependence upon total power consumption of the ring oscillator as simulated over a period of time.

8. The method of claim 1, wherein characterizing by simulation behavior of the logic cell structure comprises determining by simulation the voltage on the output of the logic cell as a function of the voltage applied at the input to the logic cell, for various loads connected to the output of the logic cell.

9. The method of claim 1, wherein the fabrication process is in development during the operation of the method.

10. A method for developing a set of design rules for a fabrication process, comprising:

for each given one of a plurality of candidate design rule sets for the fabrication process, a computer system developing a layout of a logic cell in dependence upon the given design rule set, the logic cell having an input and an output and having at least a first transistor and at least a first interconnect connected to the first transistor, a computer system simulating fabrication of the logic cell according to the fabrication process and the layout, to derive a 3-dimensional model of the logic cell structure, the logic cell structure identifying geometry and materials composition of at least the first transistor and the first interconnect in the logic cell structure, a computer system characterizing by simulation behavior of the logic cell structure, including characterizing the combined behavior of both the first transistor and the first interconnect, a computer system evaluating performance of the logic cell structure in dependence upon the behavior as characterized;

a computer system recording in a database on one or more computer readable media, in association with an indication of the given set of design rules, a set of one or more values indicating performance of the logic cell; the database being accessible to a user for use in optimizing the design rule sets for the fabrication process; and using the data recorded in the database as a basis for optimizing the design rule sets for the fabrication process, wherein characterizing by simulation behavior of the logic cell structure comprises:

calibrating a second module that characterizes FETs by a second simulation model of transistor operation, to a first module that characterizes FETs by a first simulation model of transistor operation, the second module being quicker than the first module at characterizing a particular transistor, the calibrating yielding values for calibration parameters applicable to the second simulation model; and characterizing the behavior of the logic cell structure using the calibration parameter values.

11. The method of claim 10, wherein the second module is less precise than the first module at characterizing the particular transistor.

12. The method of claim 10, wherein calibrating a second module comprises:

simulating fabrication of a sample FET according to the fabrication process, to derive a 3-dimensional model of the sample FET structure, the sample FET structure identifying geometry and materials composition of the sample FET structure;

characterizing the sample FET structure by the first simulation model to determine a set of at least one IV or CV curve for the sample FET structure; and determining the calibration parameter values for the second simulation model such that a characterization of the sample FET structure by the second simulation module yields substantially the same set of at least one IV or CV curve as determined by the first simulation model.

13. The method of claim 12, wherein the calibration parameters include at least one member of the group consisting of mobility, saturation velocity, and quantum separation.

14. The method of claim 12, wherein the second simulation model is a drift-diffusion model, and wherein characterizing the behavior of the logic cell structure comprises:

imposing a mesh in the logic cell structure, including within both the first transistor and the first interconnect; and solving continuity equations on the mesh, including within both the first transistor and the first interconnect, wherein for mesh nodes within the first transistor structure, the continuity equations depend on both the calibration parameters and the geometry and materials composition of the first transistor in the logic cell structure.

15. The method of claim 12, wherein characterizing the behavior of the logic cell structure comprises:

determining a circuit simulator compact model of the first FET, in dependence upon both the calibration parameter values and proximity effects in the logic cell structure; and determining resistance and capacitance of the first interconnect of the logic cell structure, and wherein evaluating performance of the logic cell structure comprises observing, by circuit simulation, voltage behavior at the output of the logic cell structure in response to simulated voltage changes at the input of the logic cell structure, the circuit simulation using the compact model of the first FET and the determined resistance and capacitance of the first interconnect.

16. A system for developing a set of design rules for a fabrication process, comprising:

a layout module to develop a layout of a logic cell in dependence upon the given design rule set, the logic cell having an input and an output and having at least a first transistor and at least a first interconnect connected to the first transistor;

a fabrication simulation module to simulate fabrication of the logic cell according to the fabrication process and the layout, to derive a 3-dimensional model of the logic cell structure, the logic cell structure identifying geometry and materials composition of at least the first transistor and the first interconnect in the logic cell structure;

a logic cell simulation module to characterize behavior of the logic cell structure, including characterizing the combined behavior of both the first transistor and the first interconnect;

an evaluation module to evaluate performance of the logic cell structure in dependence upon the behavior as characterized;

a recording module to record in a database, in association with an indication of the given set of design rules, a set of one or more values indicating performance of the logic cell, the database being accessible to a user for use in optimizing the design rule sets for the fabrication process;

a script executing module to operate the layout module, the fabrication simulation module, the logic cell simulation module, the evaluation module and the recording module for each given one of a plurality of candidate design rule sets for the fabrication process; and a module which uses the data recorded in the database as a basis for optimizing the design rule sets for the fabrication process.

17. The system of claim 16, wherein the logic cell includes both an N-channel FET and a P-channel FET.

18. The system of claim 16, wherein the logic cell performs a logical inversion function, and wherein the evaluation module evaluates performance of the logic cell structure in dependence upon the behavior as characterized comprises simulating operation of a ring oscillator having an odd number of stages, each of the stages being an instance of the logic cell structure.

19. The system of claim 18, wherein in evaluating performance of the logic cell structure the evaluation module further determines a performance characteristic of the logic cell in dependence upon the frequency at which the ring oscillator oscillates in the simulated operation of the ring oscillator.

20. The system of claim 19, wherein the performance characteristic of the logic cell includes switching delay.

21. The system of claim 18, wherein in evaluating performance of the logic cell structure the evaluation module further determines a performance characteristic of the logic cell in dependence upon total power consumption of the ring oscillator as simulated over a period of time.

22. The system of claim 16, wherein the characterization of the behavior of the logic cell structure by the logic cell simulation module includes referring to a database which characterizes the voltage on the output of the logic cell as a function of the voltage applied at the input to the logic cell, for various loads connected to the output of the logic cell.

23. The system of claim 16, further comprising a calibration module which calibrates a second module that characterizes FETs by a second simulation model of transistor operation, to a first module that characterizes FETs by a first simulation model of transistor operation, the second module being quicker than the first module at characterizing a particular transistor, the calibration module determining values for calibration parameters applicable to the second simulation model, and wherein the logic cell simulation module is calibrated by the values for the calibration parameters as determined by the calibration module.

24. The system of claim 23, wherein the second module is less precise than the first module at characterizing the particular transistor.

25. The system of claim 23, wherein the calibration module comprises:

a FET simulation module to simulate fabrication of a sample FET according to the fabrication process, to derive a 3-dimensional model of the sample FET structure, the sample FET structure identifying geometry and materials composition of the sample FET structure; and an FET simulation module to characterize the sample FET structure by the first simulation model to determine a set of at least one IV or CV curve for the sample FET structure, wherein the calibration module determines the calibration parameter values for the second simulation model such that a characterization of the sample FET structure by the second simulation module yields substantially the same set of at least one IV or CV curve as determined by the first simulation model.

26. The system of claim 25, wherein the calibration parameters include at least one member of the group consisting of mobility, saturation velocity, and quantum separation.

27. The system of claim 25, wherein the second simulation model is a drift-diffusion model, and wherein in characterizing the behavior of the logic cell structure the logic cell simulation module:

imposes a mesh in the logic cell structure, including within both the first transistor and the first interconnect; and solves continuity equations on the mesh, including within both the first transistor and the first interconnect, wherein for mesh nodes within the first transistor structure, the continuity equations depend on both the calibration parameters and the geometry and materials composition of the first transistor in the logic cell structure.

28. The system of claim 25, wherein in characterizing the behavior of the logic cell structure the logic cell simulation module:

determines a circuit simulator compact model of the first FET, in dependence upon both the calibration parameter values and proximity effects in the logic cell structure; and determines resistance and capacitance of the first interconnect of the logic cell structure, and wherein in evaluating performance of the logic cell structure the evaluation module observes, by circuit simulation, voltage behavior at the output of the logic cell structure in response to simulated voltage changes at the input of the logic cell structure, the circuit simulation using the compact model of the first FET and the determined resistance and capacitance of the first interconnect.

29. The system of claim 16, wherein the fabrication process according to which the logic cell is fabricated by the fabrication simulation module is a fabrication process still in development.

30. The system of claim 16, wherein the script executing module, in operating the modules, delegates operation of at least one of the layout module, the fabrication simulation module, the logic cell simulation module, and the evaluation module, to two different processor cores, one processor core for each of two different ones of the candidate design rule sets.

31. A computer readable medium having stored thereon in a non-transitory manner, a plurality of software code portions defining logic for developing a set of design rules for a fabrication process, comprising:

for each given one of a plurality of candidate design rule sets for the fabrication process, controlling a layout module to develop a layout of a logic cell in dependence upon the given design rule set, the logic cell having an input and an output and having at least a first transistor and at least a first interconnect connected to the first transistor;

controlling a fabrication simulation module to simulate fabrication of the logic cell according to the fabrication process and the layout, to derive a 3-dimensional model of the logic cell structure, the logic cell structure identifying geometry and materials composition of at least the first transistor and the first interconnect in the logic cell structure;

controlling a logic cell simulation module to characterize behavior of the logic cell structure, including characterizing the combined behavior of both the first transistor and the first interconnect;

controlling an evaluation module to evaluate performance of the logic cell structure in dependence upon the behavior as characterized;

controlling a recording module to record in a database, in association with an indication of the given set of design rules, a set of one or more values indicating performance of the logic cell, the database being accessible to a user for use in optimizing the design rule sets for the fabrication process, wherein the plurality of software code portions further define logic which uses the data recorded in the database as a basis for optimizing the design rule sets for the fabrication process.

32. The medium of claim 31, wherein the software code portions further define logic for controlling a calibration module to calibrate a second module that characterizes FETs by a second simulation model of transistor operation, to a first module that characterizes FETs by a first simulation model of transistor operation, the second module being quicker than the first module at characterizing a particular transistor, the calibration module determining values for calibration parameters applicable to the second simulation model, and wherein the logic cell simulation module is calibrated by the values for the calibration parameters as determined by the calibration module.

33. The medium of claim 32, wherein the second module is less precise than the first module at characterizing the particular transistor.

34. The medium of claim 32, wherein the calibration module comprises:

a FET simulation module to simulate fabrication of a sample FET according to the fabrication process, to derive a 3-dimensional model of the sample FET structure, the sample FET structure identifying geometry and materials composition of the sample FET structure; and an FET simulation module to characterize the sample FET structure by the first simulation model to determine a set of at least one IV or CV curve for the sample FET structure, wherein the calibration module determines the calibration parameter values for the second simulation model such that a characterization of the sample FET structure by the second simulation module yields substantially the same set of at least one IV or CV curve as determined by the first simulation model.

35. The medium of claim 31, wherein the fabrication process according to which the logic cell is fabricated by the fabrication simulation module is a fabrication process still in development.

36. The system of claim 31, wherein at least one of the layout module, the fabrication simulation module, the logic cell simulation module, and the evaluation module, are each provided on plurality of processing cores, and wherein controlling the at least one of the modules includes instructing two different processor cores to execute the at least one module, one processor core for each of two different ones of the candidate design rule sets.

* * * * *